(12) United States Patent
Hirose et al.

(10) Patent No.: US 10,276,388 B2
(45) Date of Patent: Apr. 30, 2019

(54) LASER MACHINING DEVICE AND LASER MACHINING METHOD

(71) Applicant: HAMAMATSU PHOTONICS K.K., Hamamatsu-shi, Shizuoka (JP)

(72) Inventors: Tsubasa Hirose, Hamamatsu (JP); Yuu Takiguchi, Hamamatsu (JP); Yasunori Igasaki, Hamamatsu (JP); Hideki Shimoi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 793 days.

(21) Appl. No.: 14/763,267

(22) PCT Filed: Nov. 29, 2013

(86) PCT No.: PCT/JP2013/082191
§ 371 (c)(1),
(2) Date: Jul. 24, 2015

(87) PCT Pub. No.: WO2014/119114
PCT Pub. Date: Aug. 7, 2014

(65) Prior Publication Data
US 2015/0343562 A1      Dec. 3, 2015

(30) Foreign Application Priority Data

Jan. 31, 2013 (JP) .................... 2013-016973

(51) Int. Cl.
*B23K 26/53*     (2014.01)
*B23K 26/55*     (2014.01)
(Continued)

(52) U.S. Cl.
CPC ........ *H01L 21/268* (2013.01); *B23K 26/0006* (2013.01); *B23K 26/0643* (2013.01);
(Continued)

(58) Field of Classification Search
CPC ............ B23K 26/0006; B23K 26/0643; B23K 26/0648; B23K 26/53; B23K 26/55
See application file for complete search history.

(56) References Cited

U.S. PATENT DOCUMENTS

2006/0091283 A1    5/2006   Acker et al.
2011/0304723 A1*  12/2011   Betzig .................. G02B 21/002
                                                                  348/79
(Continued)

FOREIGN PATENT DOCUMENTS

CN         102741011         10/2012
CN         102861992          1/2013
(Continued)

OTHER PUBLICATIONS

Machine translation of Japan Patent document No. 2006-130,691, May 2018.*
(Continued)

*Primary Examiner* — Geoffrey S Evans
(74) *Attorney, Agent, or Firm* — Drinker Biddle & Reath LLP

(57) ABSTRACT

A laser processing apparatus 1 is an apparatus for forming a modified region R in an object to be processed S by irradiating the object S with laser light L. The laser processing apparatus 1 comprises a laser light source 2 that emits the laser light L, a mount table 8 that supports the object S, and an optical system 11 that converges a ring part surrounding a center part including an optical axis of the laser light L in the laser light L emitted from the laser light source 2 at a predetermined part of the object S supported by the mount table 8. The optical system 11 adjusts a form of at least one of inner and outer edges of the ring part of the laser light L according to a position of the predetermined part in the object S.

18 Claims, 18 Drawing Sheets

(51) Int. Cl.
  *B23K 26/38*     (2014.01)
  *H01L 21/268*    (2006.01)
  *H01L 21/67*     (2006.01)
  *B23K 26/06*     (2014.01)
  *B23K 26/00*     (2014.01)
  *B23K 103/00*    (2006.01)

(52) U.S. Cl.
  CPC .......... *B23K 26/0648* (2013.01); *B23K 26/38* (2013.01); *B23K 26/53* (2015.10); *B23K 26/55* (2015.10); *H01L 21/67115* (2013.01); *B23K 2103/50* (2018.08)

(56) References Cited

U.S. PATENT DOCUMENTS

2012/0061356 A1* 3/2012 Fukumitsu ......... B23K 26/0057
                                                219/121.61

2012/0234808 A1* 9/2012 Nakano ............. B23K 26/0057
                                                219/121.72
2015/0360991 A1* 12/2015 Grundmueller .... B23K 26/0648
                                                428/141

FOREIGN PATENT DOCUMENTS

| | | | |
|---|---|---|---|
| JP | 2006-130691 A | * | 5/2006 |
| JP | 2009-034723 A | | 2/2009 |
| JP | 2009-255113 A | * | 11/2009 |
| JP | 2010-042424 | | 2/2010 |
| WO | WO 2010/139841 | | 12/2010 |

OTHER PUBLICATIONS

Machine translation of Japan Patent document No. 2009-255,113, May 2018.*

* cited by examiner

| Aberration correction parameter | A₁ | A₂ | A₃ |
|---|---|---|---|
| Refractive index | n | n | n |
| Wavelength | λ | λ | λ |
| Processing depth | $Z_1$ | $Z_2$ | $Z_3$ |

(b)

| Modulation pattern | $P_1$ | $P_2$ | $P_3$ |
|---|---|---|---|
| Aberration correction parameter | $A_1$ | $A_2$ | $A_3$ |
| Fracture length | $X_1$ | $X_2$ | $X_3$ |

*Fig.8*

| Modulation pattern | P₁ | P₂ | P₃ |
|---|---|---|---|
| Processing depth | $Z_1$ | $Z_2$ | $Z_3$ |
| Fracture length | $X_1$ | $X_2$ | $X_3$ |

*Fig.11*
| | Laser light center component cut ratio 0% | Laser light center component cut ratio 50% |
|---|---|---|
| Fracture length (minimum) | 12 μm | 4.5 μm |
| | 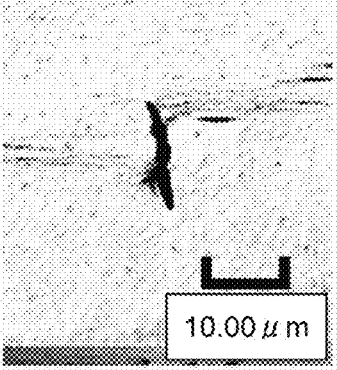 | 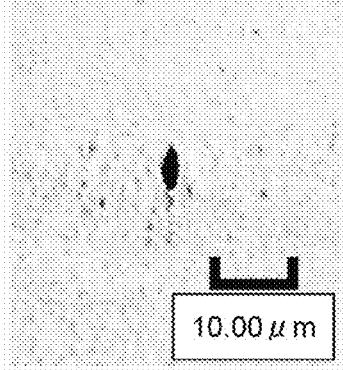 |

Fig.17
(a)
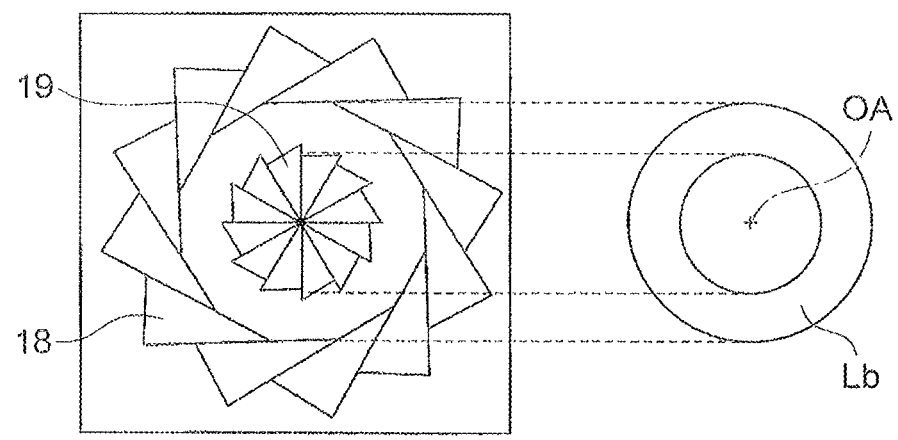
(b)
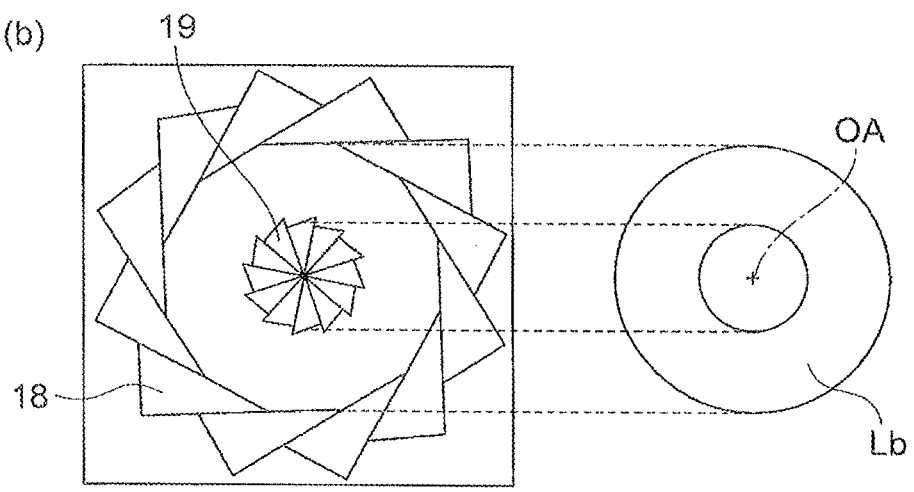

LASER MACHINING DEVICE AND LASER MACHINING METHOD

TECHNICAL FIELD

The present invention relates to a laser processing apparatus and laser processing method for forming a modified region in an object to be processed.

BACKGROUND ART

As a conventional laser processing apparatus and laser processing method, Patent Literature 1 discloses one that irradiates an object to be processed with laser light modulated by a reflective spatial light modulator such that the laser light has a predetermined wavefront within the object (or such that the laser light converged within the object has a predetermined amount of aberration or less).

CITATION LIST

Patent Literature

Patent Literature 1: Japanese Patent Application Laid-Open No. 2009-34723

SUMMARY OF INVENTION

Technical Problem

There are cases where the modified region formed by the laser processing apparatus and laser processing method such as the one mentioned above is required to be made finer, such as when forming via holes three-dimensionally in interposer substrates, when cutting thin semiconductor wafers, and when forming gettering regions in semiconductor substrates.

It is therefore an object of the present invention to provide a laser processing apparatus and laser processing method which can form a fine modified region accurately and efficiently.

Solution to Problem

The laser processing apparatus in accordance with one aspect of the present invention is a laser processing apparatus for forming a modified region in an object to be processed by irradiating the object with laser light, the apparatus comprising a laser light source that emits the laser light, a support unit that supports the object, and an optical system that converges a ring part surrounding a center part including an optical axis of the laser light in the laser light emitted from the laser light source at a predetermined part of the object supported by the support unit, the optical system adjusting a form of at least one of inner and outer edges of the ring part according to a position of the predetermined part in the object.

The inventors have found that converging a ring part of laser light (a part of the laser light, surrounding a center part including its optical axis) can form a fine modified region in the predetermined part of the object more accurately than when converging the center and ring parts of the laser light at the predetermined part of the object. The above-mentioned laser processing apparatus converges the ring part of the laser light at the predetermined part of the object and thus can form a fine modified region accurately in the predetermined part of the object. Also, the form of at least one of the inner and outer edges of the ring part of the laser light is adjusted according to the position of the predetermined part in the object, whereby the fine modified region can be formed efficiently in the predetermined part of the object. Therefore, the above-mentioned laser processing apparatus can form the fine modified region accurately and efficiently.

The ring part may have a circular ring form, and the optical system may adjust at least one of inner and outer diameters of the ring part according to the position of the predetermined part in the object. This structure makes it possible to adjust the forms of the inner and outer edges of the ring part of the laser light correctly and easily.

When the predetermined part is located within the object, the optical system may adjust the form of at least one of the inner and outer edges of the ring part according to a distance from a surface where the laser light is incident on the object to the predetermined part. This structure makes it possible to form the modified region in a desirable state (examples of which include states of size of the modified region itself and length of fractures occurring in the object from the modified region) in the predetermined part according to the distance from the surface where the laser light is incident on the object to the predetermined part.

The optical system may adjust the form of at least one of the inner and outer edges of the ring part according to a state of the modified region to be formed when the object is irradiated with the laser light. This structure makes it possible to adjust at least one of the inner and outer edges of the ring part of the laser light beforehand in order to place the modified region to be formed into a desirable state.

The laser processing apparatus may further comprise a detection unit that detects a state of the modified region formed when the object is irradiated with the laser light, and the optical system may adjust the form of at least one of the inner and outer edges of the ring part according to the state of the modified region detected by the detection unit. This structure makes it possible to adjust the form of at least one of the inner and outer edges of the ring part of the laser light immediately when the state of the modified region during or after its formation deviates from its desirable state for some reason.

The state of the modified region may include a state of length of a fracture occurring in the object from the modified region. This structure allows the fracture occurring in the object from the modified region to have a desirable length.

When the predetermined part is located within the object, the optical system may shape the laser light according to a refractive index of the object, a wavelength of the laser light, and a distance from a surface where the laser light is incident to the predetermined part so as to suppress spherical aberration occurring in the predetermined part. This structure suppresses the spherical aberration occurring in the predetermined part of the object and thus can form a finer modified region in the predetermined part of the object.

The optical system may have a spatial light modulator that modulates the laser light so as to adjust the form of at least one of inner and outer edges of the ring part and a converging optical system that converges the laser light modulated by the spatial light modulator at the predetermined part. This structure makes it possible to adjust the form of at least one of the inner and outer edges of the ring part of the laser light dynamically and instantaneously.

The laser processing method in accordance with one aspect of the present invention is a laser processing method for forming a modified region in an object to be processed by irradiating the object with laser light, the method comprising converging a ring part surrounding a center part including an optical axis of the laser light in the laser light at a predetermined part of the object while adjusting a form of at least one of inner and outer edges of the ring according to a position of the predetermined part in the object.

This laser processing method can form a fine modified region accurately and efficiently as with the above-mentioned laser processing apparatus.

Advantageous Effects of Invention

The present invention can provide a laser processing apparatus and laser processing method which can form a fine modified region accurately and efficiently.

BRIEF DESCRIPTION OF DRAWINGS

FIG. 6 is a chart illustrating an example of data tables stored in the laser processing apparatus of FIG. 1;

FIG. 8 is a chart illustrating another example of the data tables stored in the laser processing apparatus of FIG. 1;

FIG. 11 is a picture illustrating states of fractures in a cut section of a silicon wafer;

FIG. 17 is a structural diagram of a modified example of the optical system.

DESCRIPTION OF EMBODIMENTS

Figure 1:
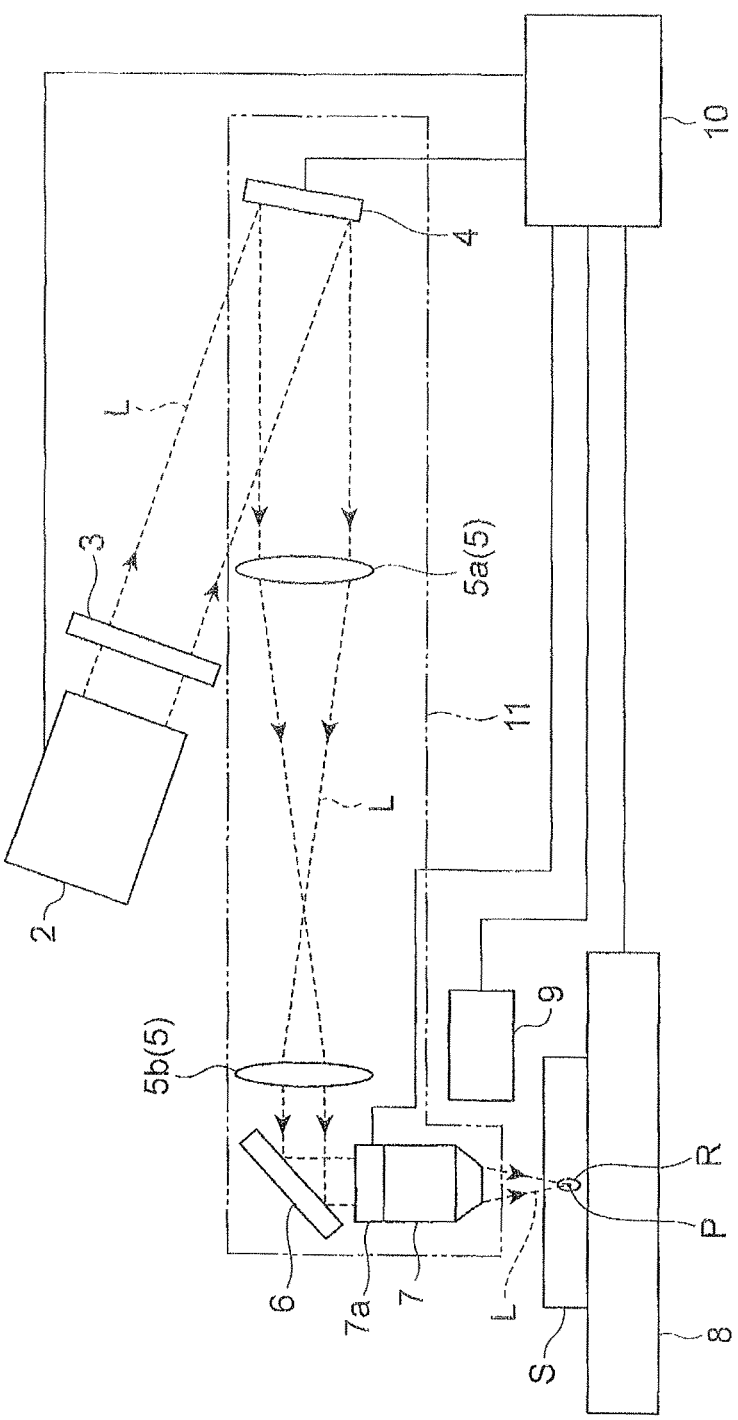
FIG. 1 is a structural diagram of the laser processing apparatus in accordance with one embodiment of the present invention.

In the following, preferred embodiments of the present invention will be explained in detail with reference to the drawings. In the drawings, the same or equivalent parts will be referred to with the same signs while omitting their overlapping descriptions.

As illustrated in FIG. 1, a laser processing apparatus 1 irradiates an object to be processed S with laser light L, thereby forming a modified region R in the object S. As will be explained in the following, the laser processing apparatus 1 is an apparatus which is effective in particular in the case where the modified region R is required to be made finer, such as when forming via holes three-dimensionally in interposer substrates, when cutting thin semiconductor wafers, and when forming gettering regions in semiconductor substrates.

Here, the laser light L is absorbed in particular in the vicinity of a converging point within the object S while being transmitted therethrough, whereby the modified region R is formed in the object S (i.e., internal absorption type laser processing). Therefore, a front face S1 of the object S hardly absorbs the laser light L and thus does not melt. In the case of forming a removing part such as a hole or groove by melting it away from the front face S1 (surface absorption type laser processing), the processing region gradually progresses from the front face S1 side to the rear face side in general.

By the modified region R are meant regions whose physical characteristics such as density, refractive index, and mechanical strength have attained states different from those of their surroundings. Examples of the modified region R include molten processed regions, crack regions, dielectric breakdown regions, refractive index changed regions, and their mixed regions. Other examples of the modified region R include areas where the density of the modified region R has changed from that of an unmodified region and areas formed with a lattice defect in a material of the object (which may also collectively be referred to as high-density transitional regions). The molten processed regions, refractive index changed regions, areas where the modified region has a density different from that of the unmodified region, or areas formed with a lattice defect may further incorporate a fracture (fissure or microcrack) therewithin or at an interface between the modified region R and the unmodified region. The incorporated fracture may be formed over the whole surface of the modified region R or in only a part or a plurality of parts thereof.

As illustrated in FIG. 1, the laser processing apparatus 1 comprises a laser light source 2, an attenuator 3, a spatial light modulator 4, a 4f optical system 5, a mirror 6, an objective lens unit (converging optical system) 7, a mount table (support unit) 8, a detection unit 9, and a control unit 10.

The laser light source 2 causes the laser light L to oscillate in a pulsating manner, for example, thereby emitting the laser light L. The laser light L has such a wavelength as to be transmitted through the object S. The attenuator 3 adjusts the output of the laser light L emitted from the laser light source 2. The spatial light modulator 4 is a spatial light modulator (SLM) made of a reflective liquid crystal (LCOS: Liquid Crystal on Silicon), for example, and modulates the laser light L emitted from the laser light source 2.

Figure 2:
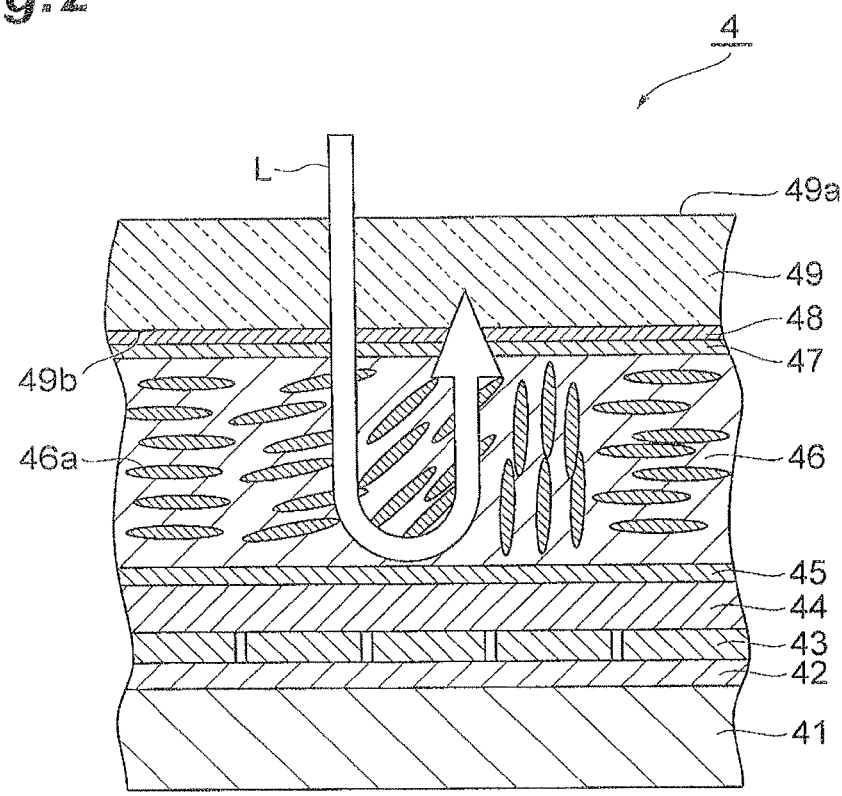
FIG. 2 is a partially enlarged sectional view of a spatial light modulator in the laser processing apparatus of FIG. 1.

The structure of the spatial light modulator 4 will now be explained. In the spatial light modulator 4, as illustrated in FIG. 2, a silicon substrate 41, a drive circuit layer 42, a plurality of pixel electrodes 43, a reflecting film 44, an alignment film 45, a liquid crystal layer 46, an alignment film 47, a transparent conductive film 48, and a transparent substrate 49 are stacked in this order.

The transparent substrate 49 is made of a light-transmitting material such as glass, for example. The transparent substrate 49 has a front face 49a, parallel to the XY plane, serving as an entrance/exit surface of the laser light L in the spatial light modulator 4. The transparent conductive film 48 is made of a light-transmitting, electrically conductive material, for example, and formed on the rear face 49b of the transparent substrate 49. The transparent substrate 49 and transparent conductive film 48 transmit the laser light L therethrough.

The pixel electrodes 43 are made of a metal material such as aluminum, for example. The pixel electrodes 43 are arranged two-dimensionally according to the arrangement of a plurality of pixels on the silicon substrate 41. The plurality of pixel electrodes 43 are driven by an active matrix circuit provided in the drive circuit layer 42. The active matrix circuit controls the voltage applied to the pixel electrodes 43 according to a light image to be outputted from the reflective spatial light modulator (i.e., according to a modulation pattern (image for modulation) inputted from the control unit 10). An example of the active matrix circuit has a first driver circuit for controlling pixel rows each aligning in the X direction and a second driver circuit for controlling pixel columns each aligning in the Y direction. This applies a predetermined voltage in conformity with the modulation pattern to the pixel electrode 43 corresponding to a pixel designated by the first and second driver circuits.

The liquid crystal layer 46 modulates the laser light L according to an electric field formed by each pixel electrode 43 and the transparent conductive film 48. The reflecting film 44 is made of a dielectric multilayer film, for example, and reflects the laser light L incident on the spatial light modulator 4. The alignment films 45, 47 align a group of liquid crystal molecules 46a of the liquid crystal layer 46 in a fixed direction. The alignment films 45, 47 are made of a polymer material, an example of which is polyimide, while their surfaces in contact with the liquid crystal layer 46 have been subjected to rubbing, for example.

When the active matrix circuit applies a predetermined voltage to a given pixel electrode 43 in thus constructed spatial light modulator 4, an electric field is formed between the pixel electrode 43 and transparent conductive film 48. This electric field is applied to the reflecting film 44 and liquid crystal layer 46 at a ratio of their respective thicknesses. As a consequence, the alignment direction of the liquid crystal molecules 46a changes according to the magnitude of the electric field applied to the liquid crystal layer 46.

At this time, the laser light L incident on the spatial light modulator 4 is modulated by the liquid crystal molecules 46a when passing through the liquid crystal layer 46, subsequently reflected by the reflecting film 44, and then modulated by the liquid crystal molecules 46a when passing through the liquid crystal layer 46 again. Thus, in the spatial light modulator 4, the phase of each ray constituting the laser light is regulated according to the modulation pattern inputted from the control unit 10, so as to adjust the wavefront of the laser light L.

Returning to FIG. 1, the 4f optical system 5 has a pair of lenses 5a, 5b and adjusts the wavefront form of the laser light L modulated by the spatial light modulator 4. In the 4f optical system 5, the distance (optical path length) between the spatial light modulator 4 and lens 5a is the focal length f1 of the lens 5a, while the distance (optical path length) between the objective lens unit 7 and lens 5b is the focal length f2 of the lens 5b. The distance (optical path length) between the lenses 5a, 5b is f1+f2, and the lenses 5a, 5b constitute a double telecentric optical system. This 4f optical system 5 can inhibit the wavefront form of the laser light L modulated by the spatial light modulator 4 from changing through spatial propagation and thereby enhancing aberration.

The mirror 6 reflects the laser light L incident thereon from the 4f optical system 5 side and makes it enter the objective lens unit 7. The objective lens unit 7 converges the incident laser light L at a predetermined part of the object S. The objective lens unit 7 has an actuator 7a such as a piezoelectric element, for example. The actuator 7a can reciprocate the objective lens unit 7 along its optical axis.

The mount table 8 supports the object S while being movable with respect to the objective lens unit 7. The mount table 8 moves with respect to the objective lens unit 7 while supporting the object S, thereby shifting a converging point P of the laser light L with respect to the object S. The actuator 7a can reciprocate the objective lens unit 7 along its optical axis in conformity with undulations of the front face of the object S according to the detected value of measurement laser light reflected by the front face of the object S.

The detection unit 9 detects the state of the modified region R formed when the object S is irradiated with the laser light L. For example, the detection unit 9 detects the amount of emission of plasma occurring in the modified region R, thereby sensing the state of length of a fracture generated in the object S from the modified region R when the object S is irradiated with the laser light L.

The control unit 10 controls the laser processing apparatus 1 as a whole. For example, the control unit 10 controls the laser light source 2 such that the output, pulse width, and the like of the laser light L emitted from the laser light source 2 attain predetermined values. The control unit 10 also generates a modulation pattern according to the detected value inputted from the detection unit 9 and feeds the modulation pattern to the spatial light modulator 4. The control unit 10 further controls operations of the mount table 8 and actuator 7a.

Figure 3:
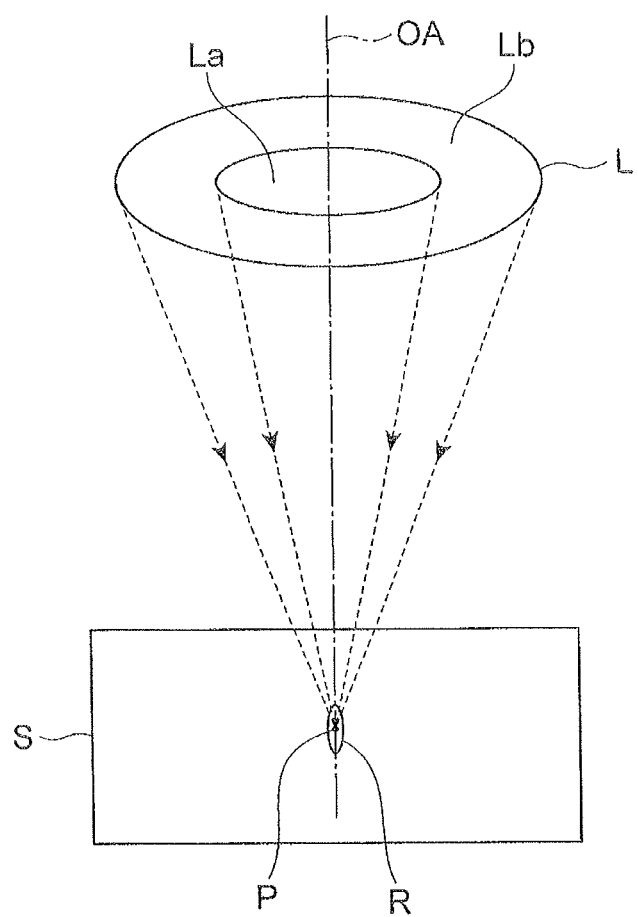
FIG. 3 is a conceptual diagram illustrating converged states of laser light in the laser processing apparatus of FIG. 1.

In the laser processing apparatus 1 constructed as in the foregoing, the spatial light modulator 4, 4f optical system 5, mirror 6, and objective lens unit 7 constitute an optical system 11. As illustrated in FIG. 3, in the laser light L, the optical system 11 cuts off a center part La which is a center component (a component with small NA in the laser light, i.e., low NA component) including its optical axis OA and converges a peripheral component (a component with large NA in the laser light, i.e., high NA component) surrounding the center part La, i.e., a ring part Lb which is a ring-shaped component, at the predetermined part of the object S. In the laser processing apparatus 1, the cutting of the center part La of the laser light L is achieved by the modulation of the laser light L by the spatial light modulator 4, while the converging of the ring part Lb of the laser light L is fulfilled by that of the laser light L by the objective lens unit 7. Here, the center part La has a circular form whose center line is the optical axis OA, while the ring part Lb has a circular ring form whose center line is the optical axis OA.

The optical system 11 adjusts the form of at least one of inner and outer edges of the ring part Lb according to the position of the predetermined part in the object S (i.e., the position at which the converging point P of the laser light L is located within the object S) and the state of the modified region R to be formed when the object S is irradiated with the laser light L.

Figure 4:
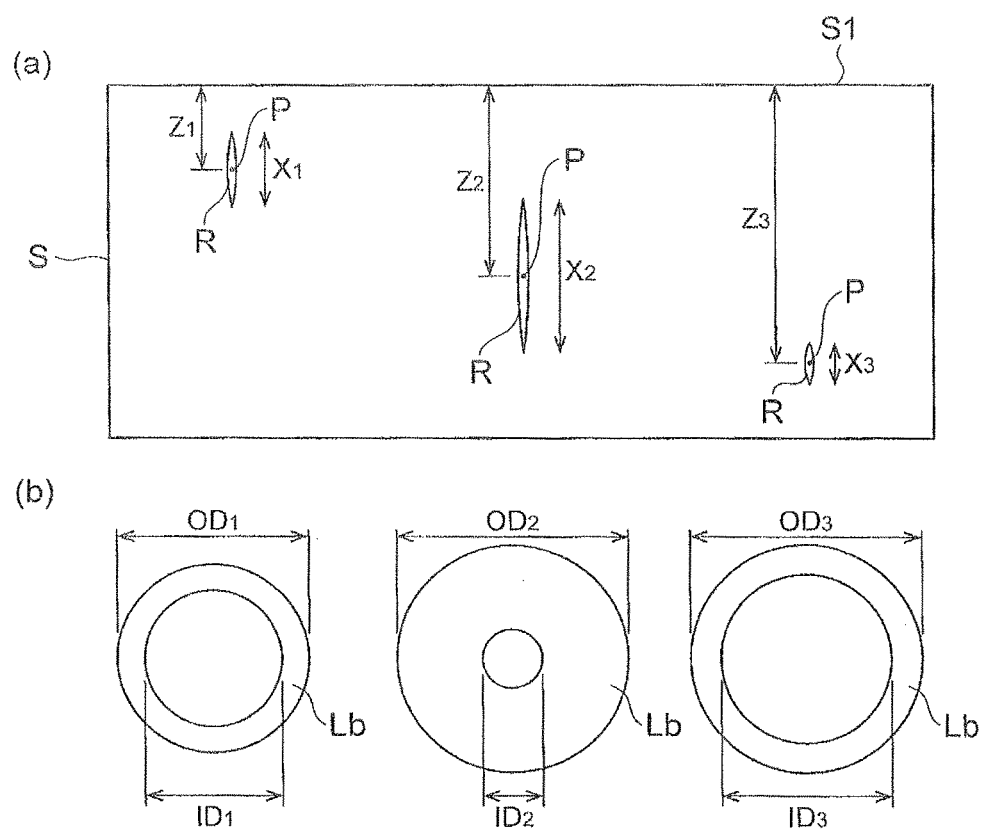
FIG. 4 is a conceptual diagram illustrating the relationship between the processing depth in the laser processing apparatus and the cross-sectional form of the laser light in the laser processing apparatus of FIG. 1.

Specifically, as illustrated in FIG. 4(a), the position of the predetermined part in the object S is a processing depth (i.e., distance from the front face S1 where the laser light is incident on the object S to the predetermined part) $Z_m$ (m=1, 2, 3, ... ). The state of the modified region R is a length $X_m$ (m=1, 2, 3, ... ) of a fracture occurring in a direction perpendicular to the front face S1 from the modified region R. When the predetermined part to be formed with the modified region R is located within the object S, the optical system 11 adjusts at least one of inner and outer diameters $ID_m$, $OD_m$ (m=1, 2, 3, ... ) of the ring part Lb, thereby regulating the form of at least one of inner and outer edges of the ring part Lb. In the laser processing apparatus 1, the adjustment of at least one of the inner and outer diameters $ID_m$, $OD_m$ of the ring part Lb (i.e., adjustment of the form of at least one of the inner and outer edges of the ring part Lb) is achieved by the modulation of the laser light L by the spatial light modulator 4. In the case of FIG. 4(b), $OD_1 < OD_2 = OD_3$, $ID_1 > ID_2 < ID_3$.

When the predetermined part to be formed with the modified region R is located within the object S, the optical system 11 shapes the laser light L according to the refractive index n of the object S, the wavelength λ of the laser light L, and the processing depth $Z_m$ so as to suppress spherical aberration occurring in the predetermined part. In the laser processing apparatus 1, the shaping of the laser light L for suppressing spherical aberration is achieved by the modulation of the laser light L by the spatial light modulator 4. When the laser light L converged by the objective lens unit 7 is incident on the object S, defocusing may occur due to the incident height of the light incident on the converging lens, so that the converging position varies depending on the incident light, thereby generating spherical aberration. At this time, the amount of shift of a paraxial ray from the converging position along the optical axis OA is longitudinal spherical aberration, and the outermost ray has the largest aberration. The longitudinal spherical aberration may also be termed longitudinal aberration, longitudinal direction aberration, longitudinal ray aberration, or longitudinal error.

An example of laser processing methods performed in the laser processing apparatus 1 will now be explained. The control unit 10 acquires the refractive index n of the object S, the wavelength λ of the laser light L, and the processing depth $Z_m$ (steps S01 to S03). The refractive index n, wavelength λ, and processing depth $Z_m$ are values inputted beforehand to the control unit 10, among which the processing depth $Z_m$ is a desirable processing depth by which the modified region R is to be formed. Subsequently, according to the refractive index n, wavelength λ, and processing depth $Z_m$ acquired by the steps S01 to S03, the control unit 10 defines an aberration correction parameter A (n, λ, $Z_m$)=$A_m$ (step S04). The control unit 10 may read out the aberration correction parameter $A_m$ corresponding to the refractive index n, wavelength λ, and processing depth $Z_m$ by referring to a data table stored beforehand in a memory as illustrated in FIG. 6(a) or calculate the aberration correction parameter $A_m$ according to the refractive index n, wavelength λ, and processing depth $Z_m$.

Figure 5:
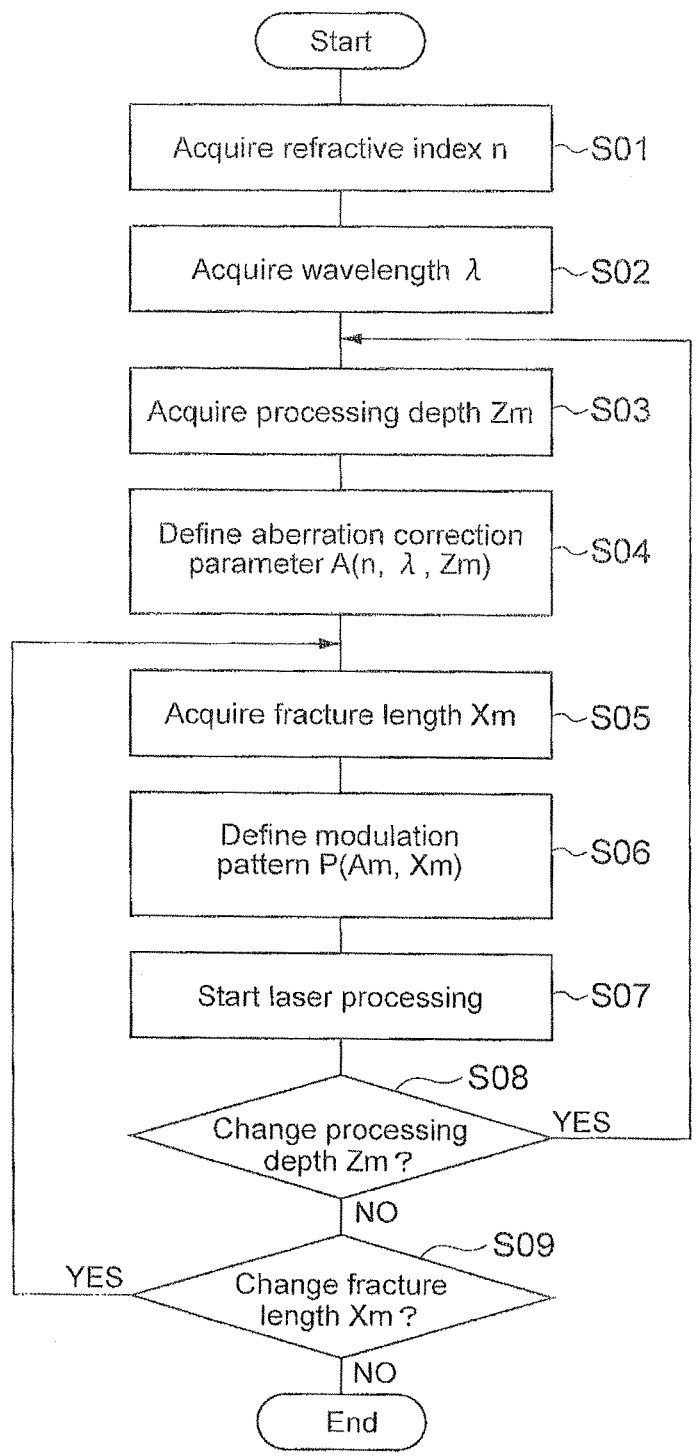
FIG. 5 is a flowchart illustrating an example of laser processing methods performed in the laser processing apparatus of FIG. 1.

Returning to FIG. 5, the control unit 10 subsequently acquires the fracture length $X_m$ (step S05). The fracture length $X_m$, which is a value inputted to the control unit 10 beforehand, is the length of a desirable fracture to be generated in the object S from the modified region R. Then, according to the aberration correction parameter $A_m$ defined by the step S04 and the fracture length $X_m$ acquired by the step S05, the control unit 10 defines a modulation pattern $P(A_m, X_m)=P_m$ (step S06). The control unit 10 may read out the modulation pattern $P_m$ corresponding to the aberration correction parameter $A_m$ and fracture length $X_m$ by referring to a data table stored beforehand in a memory as illustrated in FIG. 6(b) or calculate the modulation pattern $P_m$ according to the aberration correction parameter $A_m$ and fracture length $X_m$. The modulation pattern $P(A_m, X_m)$ is one which can adjust at least one of the inner and outer diameters $ID_m$, $OD_m$ of the ring part Lb of the laser light L and suppress spherical aberration occurring in the part to be formed with the modified region R.

Returning to FIG. 5, the control unit 10 subsequently starts laser processing (step S07). Specifically, the control unit 10 feeds the spatial light modulator 4 with the modulation pattern $P_m$ defined by the step S06 and causes the laser light source 2 to emit the laser light L under a predetermined condition. On the other hand, the control unit 10 operates the mount table 8 and actuator 7a, so as to locate the converging point P of the laser light L at the predetermined part of the object S. As a consequence, the ring part Lb of the laser light L modulated by the spatial light modulator 4 is converged with suppressed spherical aberration at the predetermined part of the object S by the objective lens unit 7.

Next, the control unit 10 determines whether the processing depth $Z_m$ is changed or not, while operating the mount table 8 and actuator 7a so as to move the position of the converging point P of the laser light L in the object S along a desirable line (step S08). When the processing depth $Z_m$ is changed as a result, the control unit 10 returns to the step S03 and performs the same processing thereafter. When the processing depth $Z_m$ is not changed as a result of the determination at the step S08, on the other hand, the control unit 10 determines-whether or not the fracture length $X_m$ is changed (step S09). When the fracture length $X_m$ is changed as a result, the control unit 10 returns to the step S05 and performs the same processing thereafter. When the fracture length $X_m$ is not changed as a result of the determination at the step S09, the control unit 10 terminates the laser processing.

Figure 7:
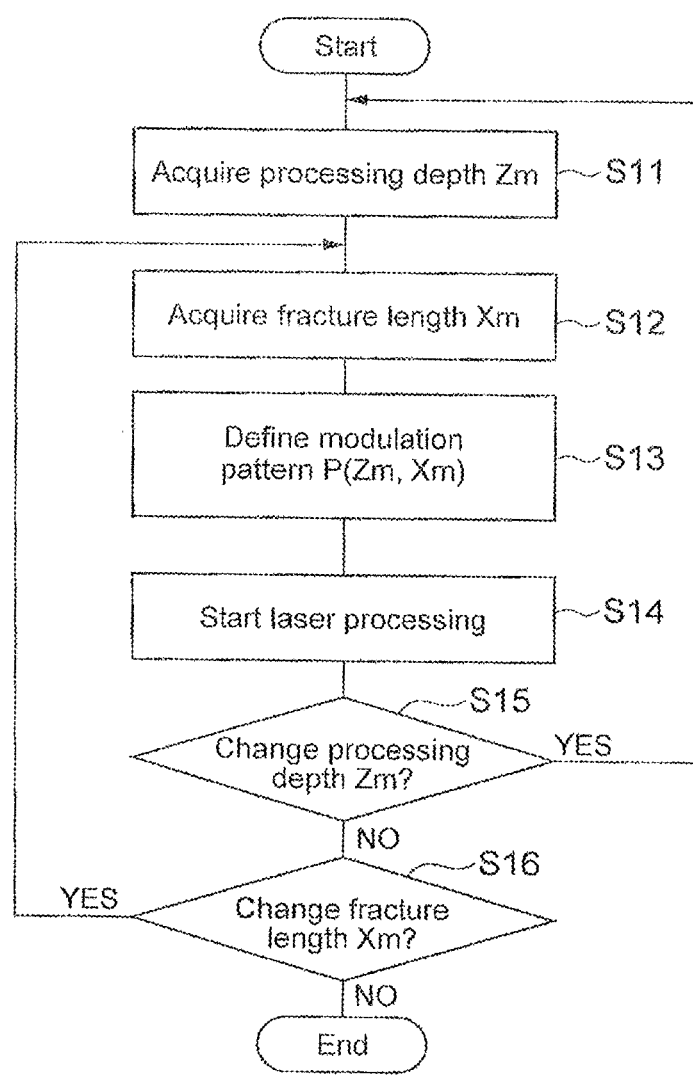
FIG. 7 is a flowchart illustrating another example of the laser processing methods performed in the laser processing apparatus of FIG. 1.

Another example of laser processing methods performed in the laser processing apparatus 1 will now be explained. As illustrated in FIG. 7, the control unit 10 acquires the processing depth $Z_m$ and fracture length $X_m$ (steps S11 and S12). The processing depth $Z_m$ and fracture length $X_m$, which are values inputted beforehand to the control unit 10, are a desirable processing depth by which the modified region R is to be formed and the length of a desirable fracture to be generated in the object S from the modified region R, respectively. Next, according to the processing depth $Z_m$ and fracture length $X_m$ acquired by the steps S11, S12, the control unit 10 defines a modulation pattern $P(Z_m, X_m)=P_m$ (step S13). The control unit 10 may read out the modulation pattern $P_m$ corresponding to the processing depth 4, and fracture length $X_m$ by referring to a data table stored beforehand in a memory as illustrated in FIG. 8 or calculate the modulation pattern $P_m$ according to the processing depth $Z_m$ and fracture length $X_m$. The modulation pattern $P(Z_m, X_m)$ is one which can adjust at least one of the inner and outer diameters $ID_m$, $OD_m$ of the ring part Lb of the laser light L.

Returning to FIG. 7, the control unit 10 subsequently starts laser processing (step S14). Specifically, the control unit 10 feeds the spatial light modulator 4 with the modulation pattern $P_m$ defined by the step S13 and causes the laser light source 2 to emit the laser light L under a predetermined condition. On the other hand, the control unit 10 operates the mount table 8 and actuator 7a, so as to locate the converging point P of the laser light L at the predetermined part of the object S. As a consequence, the ring part Lb of the laser light L modulated by the spatial light modulator 4 is converged at the predetermined part of the object S by the objective lens unit 7.

Next, the control unit 10 determines whether the processing depth $Z_m$ is changed or not, while operating the mount table 8 and actuator 7a so as to move the position of the converging point P of the laser light L in the object S along a desirable line (step S15). When the processing depth $Z_m$ is changed as a result, the control unit 10 returns to the step S11 and performs the same processing thereafter. When the processing depth $Z_m$ is not changed as a result of the determination at the step S15, on the other hand, the control unit 10 determines whether or not the fracture length $X_m$ is changed (step S16). When the fracture length $X_m$ is changed as a result, the control unit 10 returns to the step S12 and performs the same processing thereafter. When the fracture length $X_m$ is not changed as a result of the determination at the step S16, the control unit 10 terminates the laser processing.

The control unit 10 may perform the following processing in the above-mentioned one or other example of laser processing methods. That is, according to the detected value inputted from the detection unit 9, the control unit 10 acquires the state of length of a fracture generated in the object S from the modified region. R when the object S is irradiated with the laser light L. When the fracture length deviates from the desirable fracture length, the control unit 10 corrects the modulation pattern $P_m$ so that the fracture length equals the desirable fracture length, and feeds the spatial light modulator 4 with the corrected modulation pattern $P_m$. Thus feedback-controlling the spatial light modulator 4 can immediately adjust at least one of the inner and outer diameters $ID_m$, $OD_m$ of the ring part Lb of the laser light L when the length of the fracture generated from the modified region R during or after its formation deviates from the desirable fracture length for some reason.

Figure 9:
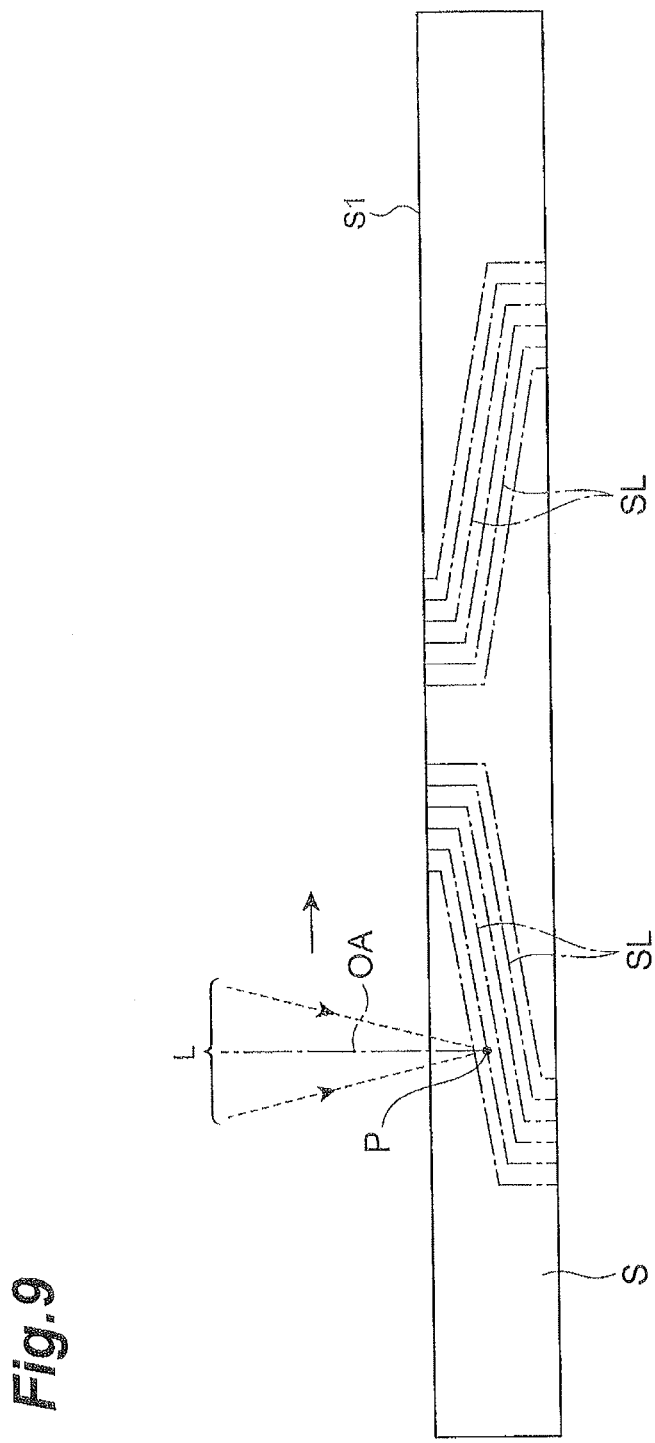
FIG. 9 is a sectional view of an interposer substrate to be processed by the laser processing apparatus of FIG. 1.

A case of three-dimensionally forming via holes in an interposer substrate by using the above-mentioned one or other example of laser processing methods will now be explained. As illustrated in FIG. 9, a silicon substrate having a thickness of about 300 μm, for example, to become an interposer substrate is prepared as the object S. Subsequently, a plurality of lines SL for three-dimensionally forming via holes are set at a pitch of about 50 μm, for example, for the object S. Then, by moving the converging point of the laser light L along each line SL as in the above-mentioned one or other example of laser processing methods, the laser processing apparatus forms a modified region R having a desirable fracture length at a desirable processing depth along each line SL.

At this time, a fine modified region R is formed by a shot of one pulse of the laser light L (i.e., one pulse of laser irradiation; laser shot), and such fine modified regions R are formed along each line SL. The fine modified regions R may be formed either continuously or intermittently on each line SL. Even when the fine modified regions R are formed intermittently, fractures respectively generated therefrom may be continuous with each other.

The object S thus having the modified regions R formed along the lines SL is subjected to anisotropic etching with KOH or the like. This selectively etches the modified regions R, thereby forming a void along each line SL. Subsequently, under vacuum compression or the like, a conductor is embedded into the void formed along each line SL. This produces an interposer substrate having via holes three-dimensionally formed therein.

As explained in the foregoing, the laser processing apparatus 1 converges the ring part Lb of the laser light L at a predetermined part of the object S. Thus converging the ring part Lb of the laser light L at the predetermined part of the object S can converge the fine modified region R at the predetermined part of the object S more accurately than when converging the center part La and ring part Lb of the laser light L at the predetermined part of the object S. Also, at this time, at least one of the inner and outer diameters of the laser light L is adjusted according to the position of the predetermined part in the object S, whereby the fine modified region R can be formed efficiently at the predetermined part of the object S. Therefore, the laser processing apparatus 1 can form the fine modified region R accurately and efficiently.

This laser processing apparatus 1 is effective in particular when the modified region R is required to be made finer, for example, such that the modified region R formed by a shot of one pulse of the laser light has a size on the order of several μm to 10 μm. Examples of the cases where the modified region R is required to be made finer include not only three-dimensionally forming via holes in interposer substrates as mentioned above, but also cutting thin semiconductor wafers made of silicon having a thickness on the order of 20 μm to 30 μm from the modified region R acting as a start point and forming gettering regions in semiconductor substrates made of silicon.

In the laser processing apparatus 1, the ring part Lb of the laser light L has a circular ring form, while the optical system 11 adjusts at least one of the inner and outer diameters of the ring part Lb of the laser light L according to the position of the predetermined part in the object S. This can adjust forms of the inner and outer edges of the ring part Lb correctly and easily.

In the laser processing apparatus 1, the optical system 11 adjusts at least one of the inner and outer diameters of the ring part Lb of the laser light L according to the processing depth (distance from the front face Si where the laser light is incident on the object S to the predetermined part) $Z_m$. This makes it possible to form the modified region R in the predetermined part in a desirable state (examples of which include states of size of the modified region R itself and length of fractures occurring in the object S from the modified region R) according to the processing depth $Z_m$.

In the laser processing apparatus 1, the optical system 11 adjusts at least one of the inner and outer diameters of the ring part Lb of the laser light L according to the state of the modified region R to be formed when irradiating the object S with the laser light L. This makes it possible to adjust at least one of the inner and outer diameters of the ring part Lb of the laser light L beforehand in order to place the modified region R to be formed in a desirable state.

In the laser processing apparatus 1, the optical system 11 shapes the laser light L according to the refractive index of the object S, the wavelength of the laser light L, and the processing depth $Z_m$ so as to suppress spherical aberration occurring in the predetermined part of the object S. This suppresses the spherical aberration occurring in the predetermined part of the object S, whereby the finer modified region R can be formed in the predetermined part of the object S.

In the laser processing apparatus 1, the optical system 11 has the spatial light modulator 4 that modulates the laser light L and the objective lens unit 7 that converges the laser light L modulated by the spatial light modulator 4 at the predetermined part of the object S. Thus using the spatial light modulator 4 that modulates the laser light L can adjust at least one of the inner and outer diameters of the ring part Lb of the laser light L dynamically and instantaneously. Feeding the spatial light modulator 4 with such a modulation pattern as to randomly diffuse the center component of the laser light L, to split off the center component from the laser light L with a grating so as to diffuse it, or the like can converge the ring part Lb alone without the center part La.

An experiment for verifying effects of the present invention will now be explained. First, a silicon wafer having a thickness of 300 µm was prepared, and a line extending parallel to the front face of the silicon wafer was set at a processing depth (distance from the front face where laser light is incident on the silicon wafer) of 100 µm. Laser light having a wavelength of 1080 nm was emitted with an oscillation at a pulse width of 150 ns, and a converging point of the laser light was moved along the line set in the silicon wafer, so as to form a modified region along the line. Subsequently, the silicon wafer was cut orthogonal to the line set therein and subjected to anisotropic etching with KOH for 2 min. Then, the length of a fracture in a void formed in a cut section of the silicon wafer upon selective etching of the modified region was measured.

Figure 10:
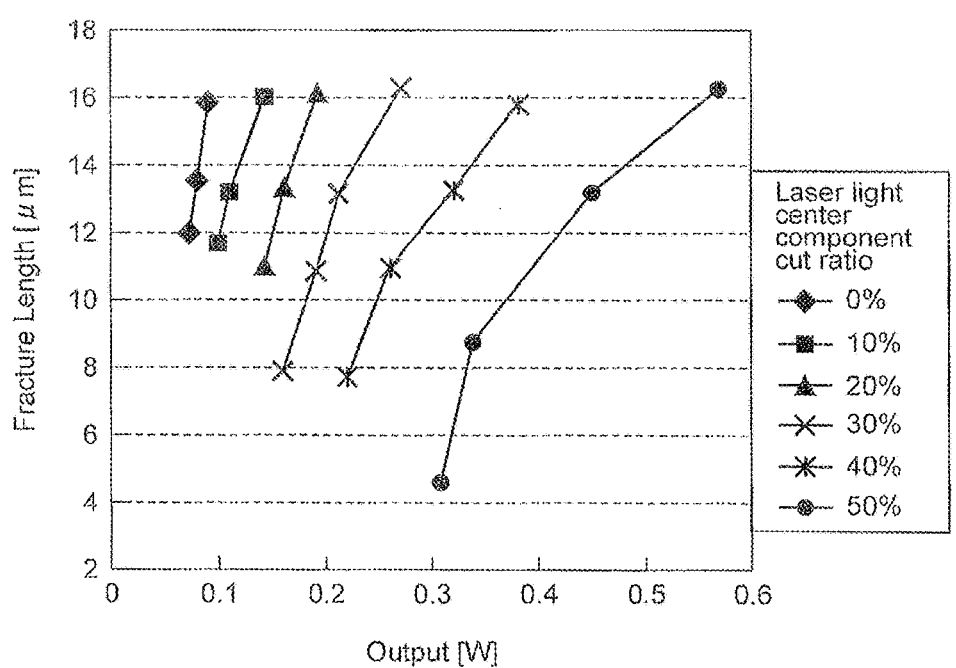
FIG. 10 is a graph illustrating the relationship between laser light output and fracture length.

In the above-mentioned experiment, a plurality of cut ratios for a center component (low NA component) were set, and a plurality of laser light outputs were set for each cut ratio for the center component, and the silicon wafer was irradiated with the laser light for each combination of the cut ratio for the center component and the output. Spherical aberration was corrected in each combination. FIG. 10 illustrates the relationship between the laser light output and fracture length in this case. By the cut ratio for the center component is meant, in a case where a ring part having a circular ring form changes its inner diameter while having a fixed outer diameter, "the ratio of the area of a center part of the laser light to the area of the ring part of the laser light in a predetermined cross section." Therefore, when the cut ratio for the center component is 0%, for example, the area of the center part of the laser light in the predetermined cross section is 0, which indicates irradiation with laser light having a circular form in the predetermined cross section.

It is seen from the experiment results illustrated in FIG. 10 that the fracture length tends to decrease as the cut ratio for the center component is greater. FIG. 11 is a picture illustrating states of fractures in cases where the silicon wafer was irradiated with the laser light at the center component cut ratios of 0% and 50% with outputs of 0.07 W and 0.31 W, respectively. It is seen from the experiment results illustrated in FIG. 11 that the fracture length, which is hard to be reduced to 10 µm or less by correcting spherical aberration alone, can be made 5 µm or smaller by cutting off the center component in addition to correcting the spherical aberration.

Figure 12:
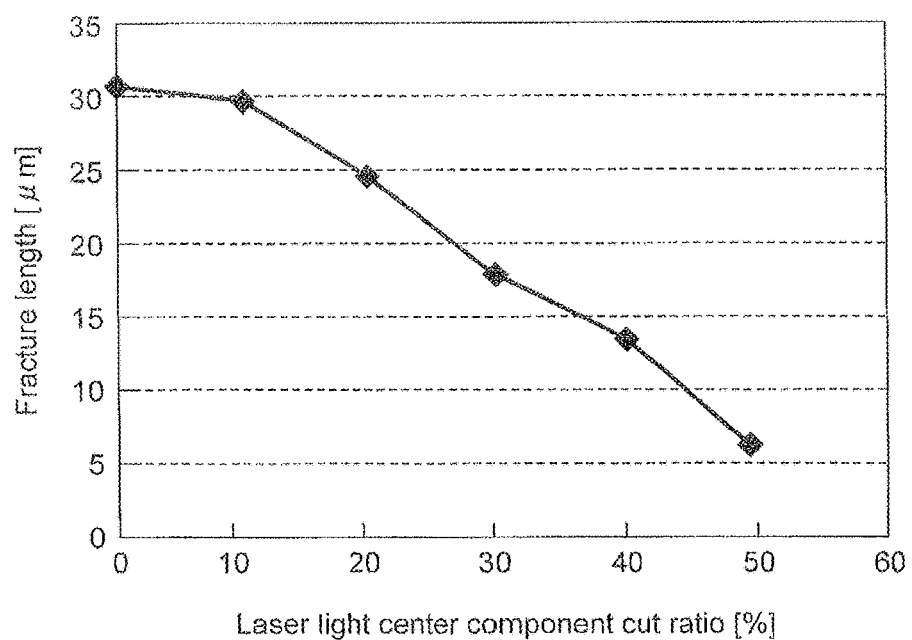
FIG. 12 is a graph illustrating the relationship between the cut ratio of a center component and the fracture length.
Figure 13:
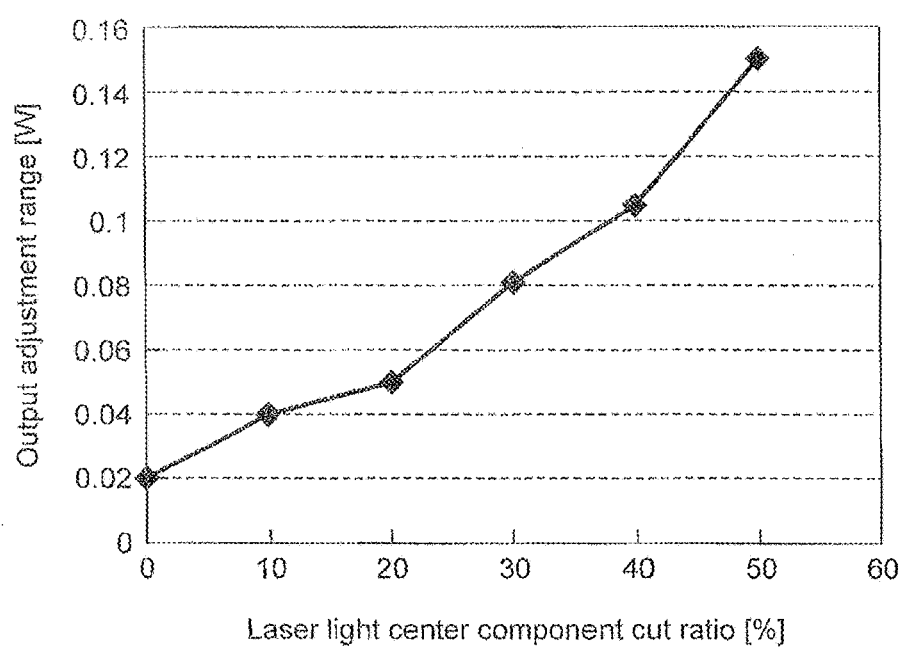
FIG. 13 is a graph illustrating the cut ratio of the center part and the output adjustment range of laser light.

Next, FIG. 12 illustrates the relationship between the center component cut ratio and fracture length in the case where the laser light output is fixed at 0.32 W. It is seen from the experiment results illustrated in FIG. 12 that the fracture length tends to decrease as the center component cut ratio is greater. Taking the difference between laser light outputs at fracture lengths of 12 µm and 16 µm as an output adjustment range, FIG. 13 illustrates the relationship between the center component cut ratio and the laser light output adjustment range. It is seen from the experiment results illustrated in FIG. 13 that the output adjustment range tends to increase as the center component cut ratio is greater. This means that the fracture length changes less with a change in the laser light output as the center component cut ratio is greater. Therefore, the laser light output can be adjusted by a greater amount (the processing margin increases) when finely regulating the fracture length as the center component cut ratio is greater. That is, controlling the center component cut ratio can adjust the fracture length while increasing the margin for adjusting the fracture length (increasing the range for selecting correct processing conditions).

Though one embodiment of the present invention is explained in the foregoing, the present invention is not limited to the above-mentioned embodiment. For example, the spatial light modulator 4 is not limited to the LCOS-SLM, but may be a MEMS-SLM, a DMD (deformable mirror device), or the like. The spatial light modulator 4 is not limited to the reflective type, but may be of a transmissive type. Other examples of the spatial light modulator 4 include those of liquid crystal cell and LCD types.

At least one of the outer and inner diameters of the ring part Lb of the laser light L, which is adjusted by the spatial light modulator 4, may be adjusted by the following optical systems.

Figure 14:
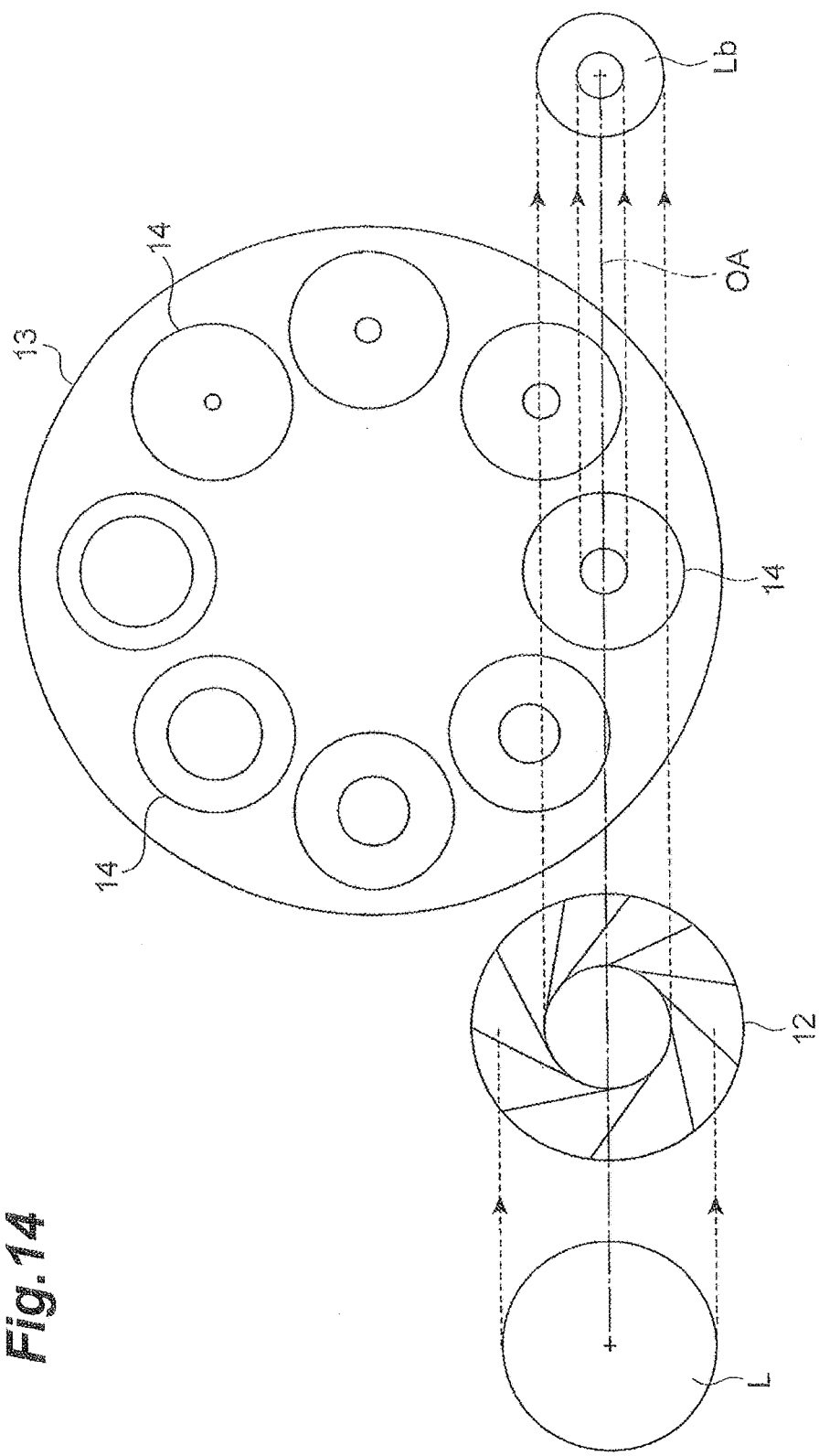
FIG. 14 is a structural diagram of a modified example of an optical system.
Figure 15:
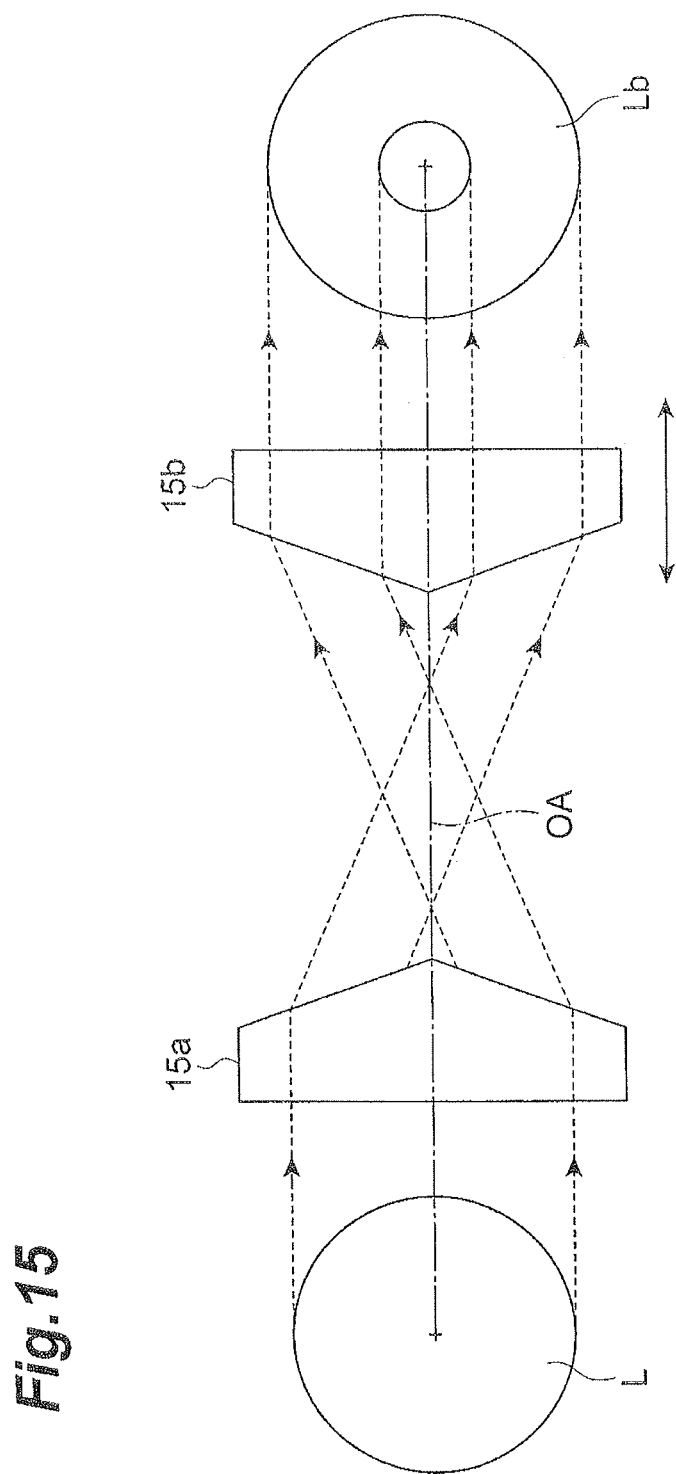
FIG. 15 is a structural diagram of a modified example of the optical system.
Figure 16:
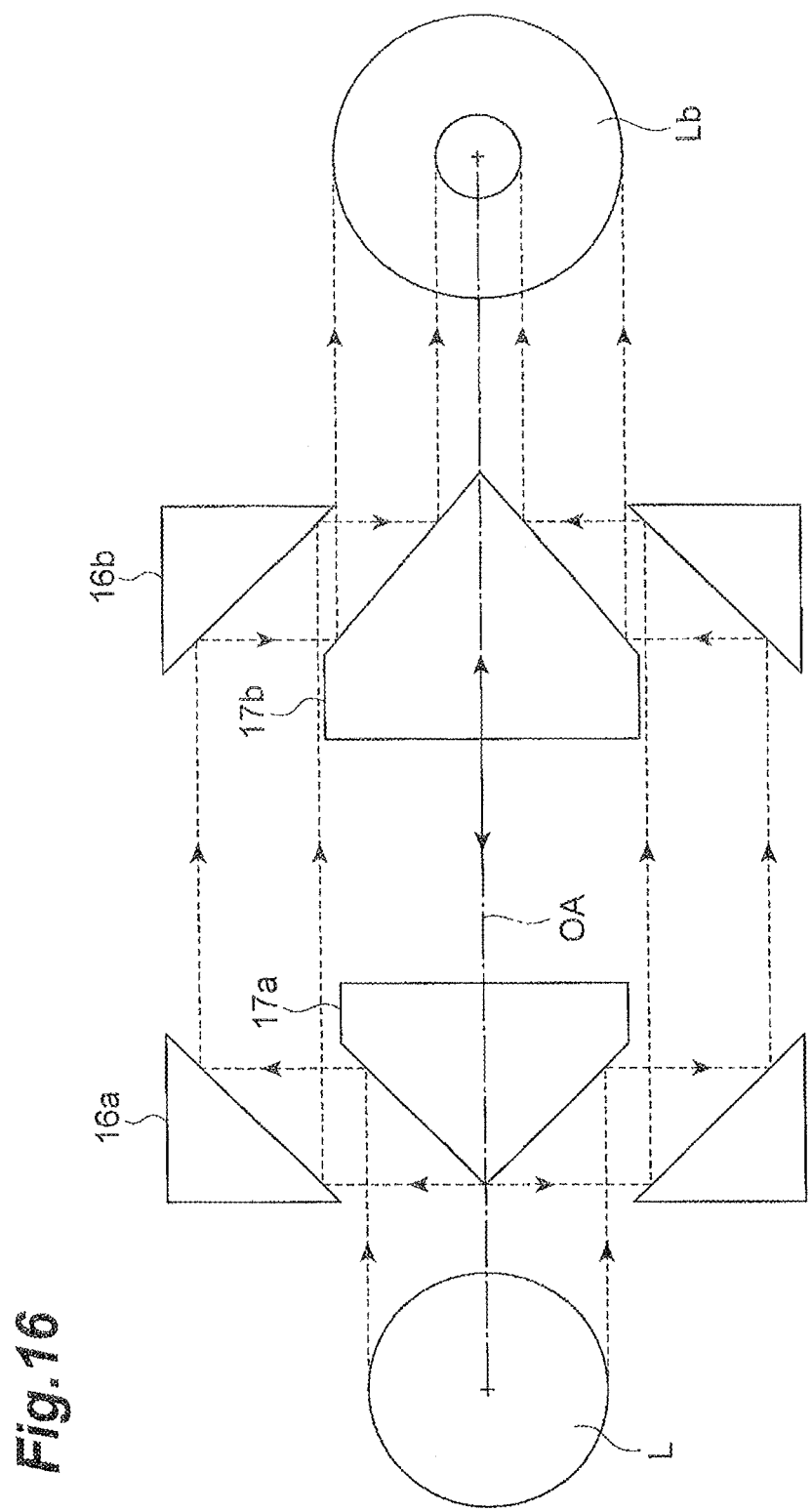
FIG. 16 is a structural diagram of a modified example of the optical system.

That is, as illustrated in FIG. 14, a variable aperture 12 may adjust the outer diameter of the ring part Lb, while a plurality of apertures 14 (having different opening diameters) attached to a rotary aperture 13 may adjust the inner diameter of the ring part Lb. As illustrated in FIG. 15, a pair of axicon lenses 15a, 15b at least one of which is movable along the optical axis OA may adjust the inner diameter of the ring part Lb. As illustrated in FIG. 16, a pair of concave conical reflectors 16a, 16b and a pair of convex conical reflectors 17a, 17b, each pair being adapted to move at least one of them along the optical axis OA, may adjust the inner diameter of the ring part Lb. As illustrated in FIG. 17, a variable aperture 18 and an outer diameter variable blade group 19 may adjust the outer and inner diameters of the ring part Lb, respectively.

While the laser light L is modulated by the spatial light modulator 4 so as to suppress spherical aberration occurring in the predetermined part of the object S in the above-mentioned embodiment, any of correction tube lenses, special optical systems, and the like may correct the spherical aberration.

The ring part Lb of the laser light L is not limited to perfect annular forms, but may be ring forms with elliptical inner and outer edges, for example. The optical system 11 also adjusts at least one of the inner and outer edges of the ring part Lb according to the position of the predetermined part in the object S in this case.

Figure 18:
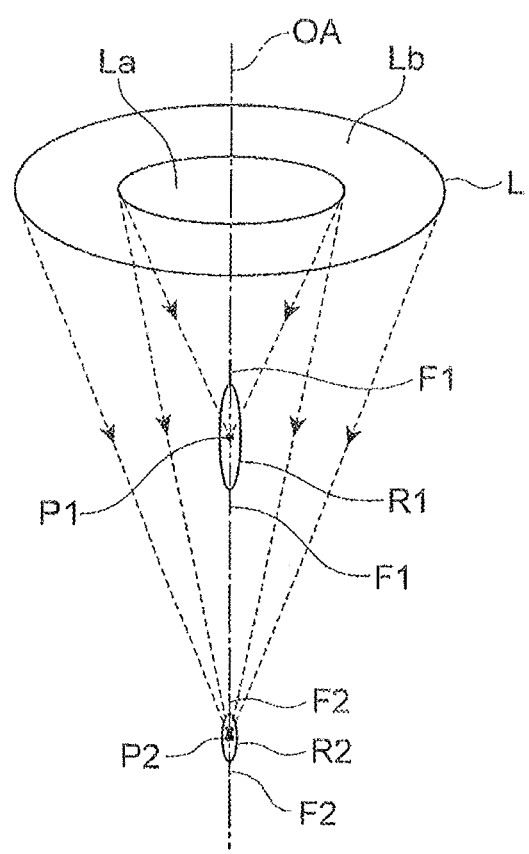
FIG. 18 is a conceptual diagram illustrating a converged state of laser light in a modified example of the laser processing methods.

As illustrated in FIG. 18, the center part La and ring part Lb of the laser light L may be converged at different positions in the object S at the same time. When cutting the planar object S from the modified region R acting as a start point, for example, the center part La of the laser light L is converged at a center part in the thickness direction of the object S, so as to form a relatively large modified region R1 and a fracture F1 extending in the thickness direction of the object S from the modified region R1. On the other hand, the ring part Lb of the laser light L is converged at a part near the front or rear face of the object S, so as to form a relatively small modified region R2 and a fracture F2 extending in the thickness direction of the object S from the modified region R2. Thus forming a plurality of rows of modified regions R1, R2 aligning in the thickness direction of the object S along a line to cut the object S makes it possible to cut the object S along the line easily and accurately. Forming the fine modified region R2 and fracture F2 in a part near the front or rear face of the object S also makes it possible to cut a functional element layer, which is formed in a part near the front or rear face of the object S, accurately along the line.

INDUSTRIAL APPLICABILITY

The present invention can provide a laser processing apparatus and laser processing method which can form a fine modified region accurately and efficiently.

REFERENCE SIGNS LIST

1: laser processing apparatus; 2: laser light source; 4: spatial light modulator; 7: objective lens unit (converging optical system); 8: mount table (support unit); 9: detection unit; 11: optical system.

The invention claimed is:

1. A laser processing apparatus for forming a modified region in an object to be processed by irradiating the object with laser light, the apparatus comprising:
 a laser light source that emits the laser light;
 a support unit that supports the object; and
 an optical system that converges a ring part surrounding a center part including an optical axis of the laser light in the laser light emitted from the laser light source at a predetermined part of the object supported by the support unit;
 a detection unit configured to detect a state of the modified region formed when the object is irradiated with the laser light;
 wherein the optical system adjusts a form of at least one of inner and outer edges of the ring part according to a position of the predetermined part in the object and the state of the modified region detected by the detection unit.

2. The laser processing apparatus according to claim 1, wherein the ring part has a circular ring form; and
 wherein the optical system adjusts at least one of inner and outer diameters of the ring part according to the position of the predetermined part in the object.

3. The laser processing apparatus according to claim 1, wherein, when the predetermined part is located within the object, the optical system adjusts the form of at least one of the inner and outer edges of the ring part according to a distance from a surface where the laser light is incident on the object to the predetermined part.

4. The laser processing, apparatus according to claim 1, wherein the optical system adjusts the form of at least one of the inner and outer edges of the ring part according to the state of the modified region to be formed when the object is irradiated with the laser light.

5. The laser processing apparatus according to claim 1, wherein, when the predetermined part is located within the object, the optical system shapes the laser light according to a refractive index of the object, a wavelength of the laser light, and a distance from a surface where the laser light is incident to the predetermined part so as to suppress spherical aberration occurring in the predetermined part.

6. The laser processing apparatus according to claim 1, wherein the optical system has:
 a spatial light modulator that modulates the laser light so as to adjust the form of at least one of inner and outer edges of the ring part; and
 a converging optical system that converges the laser light modulated by the spatial light modulator at the predetermined part.

7. The laser processing apparatus according to claim 1, wherein the state of the modified region includes a state of length of a fracture occurring in the object from the modified region.

8. A laser processing apparatus for forming a modified region in an object to he processed by irradiating the object with laser light, the apparatus comprising:
 a laser light source that emits the laser light;
 a support unit that supports the object; and
 an optical system that converges a ring part surrounding a center part including an optical axis of the laser light in the laser light emitted from the laser light source at a predetermined part of the object supported by the support unit;
 wherein the optical system adjusts a form of at least one of inner and outer edges of the ring part according to a position of the predetermined part in the object and a state of the modified region to be formed when the object is irradiated with the laser light;
 wherein the state of the modified region includes a state of length of a fracture, occurring in the object from the modified region.

9. The laser processing apparatus according to claim 8, wherein the ring part has a circular ring form; and
 wherein the optical system adjusts at least one of inner and outer diameters of the ring part according to the position of the predetermined part in the object.

10. The laser processing apparatus according to claim 8, wherein, when the predetermined part is located within the object, the optical system adjusts the form of at least one of the inner and outer edges of the ring part according to a distance from a surface where the laser light is incident on the object to the predetermined part.

11. The laser processing apparatus according to claim 8, farther comprising a detection unit configured to detect the state of the modified region formed when the object is irradiated with the laser light;
 wherein the optical system adjusts the form of at least one of the inner and outer edges of the ring part according to the state of the modified region detected by the detection unit.

12. The laser processing apparatus according to claim 8, wherein, when the predetermined part is located within the object, the optical system shapes the laser light according to a refractive index of the object, a wavelength of the laser light, and a distance from a surface where the laser light is incident to the predetermined part so as to suppress spherical aberration occurring in the predetermined part.

13. The laser processing apparatus according to claim 8, wherein the optical system comprises:
 a spatial light modulator that modulates the laser light so as to adjust the form of at least one of inner and outer edges of the ring part; and
 a converging optical system that converges the laser light modulated by the spatial light modulator at the predetermined part.

14. A laser processing apparatus for forming a modified region in an object to be processed by irradiating the object with laser light, the apparatus comprising:
 a laser light source that emits the laser light;
 a support unit that supports the object; and
 an optical system that converges a ring part surrounding a center part including an optical axis of the laser light in the laser light emitted from the laser light source at a predetermined part of the object supported by the support unit;
 wherein the optical system adjusts a form of at least one of inner and outer edges of the ring part according to a position of the predetermined part in the object,
 wherein, when the predetermined part is located within the object, the optical system shapes the laser light according to a refractive index of the object, a wavelength of the laser light, and a distance from a surface where the laser light is incident to the predetermined part so as to suppress spherical aberration occurring in the predetermined part.

15. The laser processing apparatus according to claim 14, wherein the ring part has a circular ring form; and
   wherein the optical system adjusts at least one of inner and outer diameters of the ring part according to the position of the predetermined part in the object.

16. The laser processing apparatus according to claim 14, wherein, when the predetermined part is located within the object, the optical system adjusts the form of at least one of the inner and outer edges of the ring part according to a distance from a surface where the laser light is incident on the object to the predetermined part.

17. The laser processing apparatus according to claim 14, wherein the optical system adjusts the form of at least one of the inner and outer edges of the ring part according to a state of the modified region to be formed when time object is irradiated with the laser light.

18. The laser processing apparatus according to claim 14, wherein the optical system has:
   a spatial light modulator that modulates the laser light so as to adjust the form of at least one of inner and outer edges of the ring part; and
   a converging optical system that converges the laser light modulated by the spatial light modulator at the predetermined part.

* * * * *